United States Patent
Bar et al.

(10) Patent No.: US 9,431,118 B1
(45) Date of Patent: *Aug. 30, 2016

(54) SYSTEM, METHOD AND COMPUTER PROGRAM PRODUCT FOR PROCESSING READ THRESHOLD INFORMATION AND FOR READING A FLASH MEMORY MODULE

(71) Applicant: AVAGO TECHNOLOGIES GENERAL IP (SINGAPORE) PTE. LTD., Yishun (SG)

(72) Inventors: Ilan Bar, Kiriat Motzkin (IL); Hanan Weingarten, Herzelia (IL)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/275,096

(22) Filed: May 12, 2014

Related U.S. Application Data

(63) Continuation of application No. 13/483,340, filed on May 30, 2012, now Pat. No. 8,879,325.

(51) Int. Cl.
*G11C 11/34* (2006.01)
*G11C 16/26* (2006.01)

(52) U.S. Cl.
CPC ..................... *G11C 16/26* (2013.01)

(58) Field of Classification Search
CPC .......... G11C 16/0483; G11C 11/5642; G11C 16/26; G11C 29/50004; G11C 16/04
USPC .............. 365/185.2, 185.11, 185.12, 185.17, 365/185.22, 185.23, 185.24, 185.33, 365/189.011, 189.15
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Ranjeet et al. |
| 5,640,529 A | 6/1997 | Hasbun |

(Continued)

FOREIGN PATENT DOCUMENTS

WO   WO2009053963 A2   4/2009

OTHER PUBLICATIONS

Search Report of PCT Patent Application WO 2009/118720 A3, Mar 4, 2010.

(Continued)

*Primary Examiner* — Fernando Hidalgo

(57) ABSTRACT

A method comprising: generating or receiving read threshold information indicative of multiple read thresholds values that were applied when reading multiple flash memory cells that belong to multiple rows of a flash memory module; and generating a compressed representation of reference read thresholds to be applied during future read operations of the flash memory cells in response to the read threshold information.

51 Claims, 10 Drawing Sheets

(56) References Cited

U.S. PATENT DOCUMENTS

| | | |
|---|---|---|
| 5,657,332 A | 8/1997 | Auclair et al. |
| 5,663,901 A | 9/1997 | Harari et al. |
| 5,724,538 A | 3/1998 | Bryg |
| 5,729,490 A | 3/1998 | Calligaro et al. |
| 5,740,395 A | 4/1998 | Wells |
| 5,745,418 A | 4/1998 | Hu et al. |
| 5,778,430 A | 7/1998 | Ish |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 2001/0034815 A1 | 10/2001 | Dugan et al. |
| 2002/0063774 A1 | 5/2002 | Hillis et al. |
| 2002/0085419 A1 | 7/2002 | Kwon |
| 2002/0154769 A1 | 10/2002 | Petersen et al. |
| 2002/0156988 A1 | 10/2002 | Toyama |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1* | 1/2005 | Ban ............ 365/185.2 |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |

(56) References Cited

U.S. PATENT DOCUMENTS

| | | |
|---|---|---|
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0017684 A1* | 1/2010 | Yang .............................. 714/773 |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0293321 A1 | 11/2010 | Weingarten |
| 2010/0318724 A1 | 12/2010 | Yeh |
| 2011/0007573 A1* | 1/2011 | Alrod et al. ............. 365/185.24 |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008386 A1* | 1/2012 | Chilappagari et al. .... 365/185.2 |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |

(56) References Cited

U.S. PATENT DOCUMENTS

2012/0110250 A1  5/2012  Sabbag et al.
2012/0124273 A1  5/2012  Goss et al.
2012/0246391 A1  9/2012  Meir

OTHER PUBLICATIONS

Search Report of PCT Patent Application WO 2009/095902 A3, Mar 4, 2010.
Search Report of PCT Patent Application WO 2009/078006 A3, Mar 4, 2010.
Search Report of PCT Patent Application WO 2009/074979 A3, Mar 4, 2010.
Search Report of PCT Patent Application WO 2009/074978 A3, Mar 4, 2010.
Search Report of PCT Patent Application WO 2009/072105 A3, Mar 4, 2010.
Search Report of PCT Patent Application WO 2009/072104 A3, Mar 4, 2010.
Search Report of PCT Patent Application WO 2009/072103 A3, Mar 4, 2010.
Search Report of PCT Patent Application WO 2009/072102 A3, Mar 4, 2010.
Search Report of PCT Patent Application WO 2009/072101 A3, Mar 4, 2010.
Search Report of PCT Patent Application WO 2009/072100 A3, Mar 4, 2010.
Search Report of PCT Patent Application WO 2009/053963 A3, Mar 4, 2010.
Search Report of PCT Patent Application WO 2009/053962 A3, Mar 4, 2010.
Search Report of PCT Patent Application WO 2009/053961 A3, Mar 4, 2010.
Search Report of PCT Patent Application WO 2009/037697 A3, Mar 4, 2010.
Yani Chen, Keshab K. Parhi, "Small Area Parallel Chien Search Architectures for Long BCH Codes", Ieee Transactions On Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction To Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com), Oct. 2005.

Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell Nrom Reliability", Appears on the website of Saifun.com , 2005.
Paulo Cappelletti, Clara Golla, Piero Olivo, Enrico Zanoni, "Flash Memories", Kluwer Academic Publishers, 1999.
Jedec Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., " Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

| |
|---|
| Clustering rows of the flash memory modules to clusters in response to read threshold information associated with the rows, and selecting a subset of rows from each cluster to provide the multiple reference rows. 811 |
| Applying a principle component analysis (PCA) on read thresholds statistics to provide a group of singular vectors such as V1...Vt mentioned above. These singular vectors can form the covariance matrix or be a part of the covariance matrix. 812 |
| Selecting the group of singular vectors out multiple singular vectors that are calculated during 812. 813 |
| Representing each group of read thresholds of a row of the flash memory module by a set of coefficients that map the group of read thresholds to the group of singular vectors. 814 |
| Applying a vector quantization algorithm on multiple vectors, each vector represents read thresholds associated with a row of the flesh memory module. 815 |
| Partitioning a multi-dimension space to multiple subsets of the multi-dimensional space; and representing each of the subsets of the multi-dimensional space by a subset representative. Wherein the multi-dimensional space represents read threshold statistics of a plurality of rows of the flash memory module; and wherein a memory space required for storing all the subset representatives is smaller than a memory space required for storing the read threshold statistics. 816 |
| Calculating a subset representative that represents a median value of values included in a subset of the multi-dimensional space that is represented by the subset representative. 817 |
| Representing the subsets (of 817) of the multi-dimensional space by a tree. 818 |
| Representing the subsets of the multi-dimensional space by a tree that multiple levels, each level comprises a plurality of nodes, wherein each partition iteration is represented by a single level out of the multiple levels. 819 |

SYSTEM, METHOD AND COMPUTER PROGRAM PRODUCT FOR PROCESSING READ THRESHOLD INFORMATION AND FOR READING A FLASH MEMORY MODULE

CROSS REFERENCE TO RELATED APPLICATIONS

This application is a continuation and claims priority of U.S. patent application Ser. No. 13/483,340, entitled "SYSTEM, METHOD AND COMPUTER PROGRAM PRODUCT FOR PROCESSING READ THRESHOLD INFORMATION AND FOR READING A FLASH MEMORY MODULE," filed on May 30, 2012, now U.S. Pat. No. 8,879,325, which is incorporated by reference herein in its entirety.

BACKGROUND OF THE INVENTION

Flash memory devices store information as charge in a flash memory cell. Multi-Level (MLC) flash memory devices store k bits per cell using 2 by the power of k levels of charge. The amount of charge depends on the sequence of k bits being stored. For a certain sequence of k bits, the charge being stored may be distributed within a small range. FIG. 1 illustrates a threshold voltage distribution of three bits per cell (bpc) MLC flash memory device, the threshold voltage distribution includes eight lobes 11-18 that represent eight possible logical values, and seven read thresholds 21-27. As long as the lobes are sufficiently distinct, the cell may be reliably read.

The threshold voltage distribution of FIG. 1 illustrates non-overlapping lobes 11-18, however this is only schematic, and in practical cases the lobes may overlap. The overlapping can be intentional—for obtaining high programming speed. Alternatively, the overlapping may result from the retention effect.

A Flash memory device may be partitioned to pages. An old page may introduce greater overlap between lobes than a new page, since after many program and erase (P/E) cycles there is accumulated trap charge, which is de-trapped over time. After a long duration, every lobe may have a larger standard deviation (std) and may have a different mean location. These effects are also known as retention.

Overlap may also occur irrespective of retention. The Flash cells may deteriorate following P/E cycles and the write operation may become less accurate as a result.

The 3-bpc flash memory cell stores a most significant bit (MSB), a central significant bit (CSB) and a least significant bit (LSB). A physical page of Flash memory device may store three logical pages. This physical page is programmed one logical page after the other.

The programming includes various types of programming such as MSB programming, CSB programming and LSB programming.

MSB programming includes programming some of the flash memory cells of a page to a single lobe and some are left in the erase state. At the end of the MSB programming process only two lobes exists, the erase and the MSB lobes.

CSB programming includes splitting the erase lobe and the MSB lobe into two lobes by further programming pulses, depending on the original state of each cell and the corresponding CSB bit. At the end of the CSB programming there are four lobes.

LSB programming includes splitting the four lobes to create 8 lobes.

The logical pages are read by applying various types of read operations such as MSB read (in which a MSB read threshold such as 24 of FIG. 1 is used), CSB read (in which two CSB read thresholds such as read thresholds 22 and 26 of FIG. 1 are used) and LSB read (in which four LSB read thresholds such as read thresholds 21, 23, 25 and 27 of FIG. 1 are used).

FIG. 2 shows similar distributions for the case of 2 bpc devices—four lobes 31-33 and three read thresholds 41-43.

As mentioned, the threshold voltage distributions are not constant throughout the life of the Flash memory device and may change with retention and P/E cycles. With retention, the lobes of the threshold voltage distribution become wider and shift towards the erase level. The higher the retention the larger the shift. This effectively shrinks the effective working window. Both the shrinkage of the window and the fattening of the threshold voltage distributions contribute to the increase in number of errors after performing a page read.

FIG. 3 illustrates these effects—the upper part of FIG. 3 illustrates threshold voltage distribution 60 immediately after programming—it includes spaced apart lobes 61-68 and read thresholds 51-57, while the lower part of FIG. 3 illustrates threshold voltage distribution 80 after retention—it includes partially overlapping lobes 81-88 and read thresholds 71-77. These effects become significantly worse as the block P/E cycles increase and as the NAND Flash memory technology node shrinks.

The retention forces a change in the read thresholds—as using the same set of read thresholds just following a programming operation and following retention may contribute to the number of read errors. It is therefore a need to adjust the read thresholds to reduce read errors.

In order to reduce read errors there is a need to maintain read thresholds per row of flash memory device.

Flash memory devices are typically divided into erase blocks. Each erase block includes multiple rows, where each row includes multiple flash memory cells (cells). All cells in a row are programmed simultaneously. For example, in a 3 bpc MLC device, all MSB bits of all cells in a row are programmed together, all CSB bits are programmed together and all LSB bits are programmed together. Each such group of bits is referred to as a page. All pages in an erase block are erased simultaneously. One cannot erase a single page.

The state of an erase block (which is a function of its retention and endurance) can include the set of optimally positioned read thresholds required to read each of its pages.

For a 3 bpc MLC device, which has 64 rows, with 192 pages per block, we would require 64×7=448 read threshold values per block. Note that the state of each row may be defined by the 7 read thresholds illustrated in FIG. 1 (1 for the LSB page, 2 for the CSB page and 4 for the LSB page).

Assuming that each read threshold may require 1 byte of storage and assuming that the entire system may have 10K erase blocks, we would require more than 4 MB to store the state of all the erase blocks in the system. This requirement may be difficult to fulfill in an embedded system.

SUMMARY

According to an embodiment of the invention a method may be provided and may include generating or receiving read threshold information indicative of multiple read thresholds values that were applied when reading multiple flash memory cells that belong to multiple rows of a flash memory module; and generating a compressed representation of reference read thresholds to be applied during future read operations of the flash memory cells in response to the read threshold information.

The method further may include calculating a group of read thresholds to be applied during a reading operation of a set of flash memory cells that belong to a certain row of the multiple rows of the flash memory module, the calculating is based upon the compressed representation of reference read thresholds; and reading the set of flash memory cells by applying the group of reference read thresholds to provide read results.

Values of the reference read thresholds may form a subset of possible values of actual read thresholds to be applied when reading the flash memory module.

The multiple reference rows may form a subset of rows of the flash memory module.

Values of the reference read thresholds may form a subset of possible values of actual read thresholds to be applied when reading the flash memory module.

The method, wherein the calculating may include calculating at least one reference read threshold based upon the compressed representation of the reference read thresholds; estimating read thresholds of the certain row based upon (a) the at least one reference read threshold and (b) estimators that correlate between the at least one reference read threshold and estimated read thresholds of the certain row.

The method may include calculating the estimators by linear minimum square algorithm or by least squares estimators.

The method may include updating at least one reference read threshold of a reference row in response to the read results and in response to estimators that correlate between the certain row and the reference row.

The generating of the compressed representation may include clustering rows of the flash memory modules to clusters in response to read threshold information associated with the rows, and selecting a subset of rows from each cluster to provide the multiple reference rows.

The generating of the compressed representation may include applying a principle component analysis on read thresholds statistics to provide a group of singular vectors; and representing each group of read thresholds of a row of the flash memory module by a set of coefficients that map the group of read thresholds to the group of singular vectors.

The method may include selecting the group of singular vectors out multiple singular vectors that are calculated during the applying of the principle component analysis.

The generating of the compressed representation may include applying a vector quantization algorithm on multiple vectors; each vector represents read thresholds associated with a row of the flesh memory module.

The generating of the compressed representation may include: partitioning a multi-dimension space to multiple subsets of the multi-dimensional space; and representing each of the subsets of the multi-dimensional space by a subset representative; wherein the multi-dimensional space represents read threshold statistics of a plurality of rows of the flash memory module; and wherein a memory space required for storing all the subset representatives is smaller than a memory space required for storing the read threshold statistics.

A subset representative may represent a median value of values included in a subset of the multi-dimensional space that is represented by the subset representative.

The method may include representing the subsets of the multi-dimensional space by a tree The partitioning may include applying multiple partitioning iterations.

The method may include representing the subsets of the multi-dimensional space by a tree that may include multiple levels; each level may include a plurality of nodes, wherein each partition iteration is represented by a single level out of the multiple levels.

Each node may include location information indicative of a location of the node in the tree, and partition information indicative of a partition value of a partition iteration that corresponds to the level of the node.

According to an embodiment of the invention the may be provided a non-transitory computer readable medium that stores instructions for: generating or receiving read threshold information indicative of multiple read thresholds values that were applied when reading multiple flash memory cells that belong to multiple rows of a flash memory module; generating a compressed representation of reference read thresholds to be applied during future read operations of the flash memory cells in response to the read threshold information.

The non-transitory computer readable medium may include instructions for: calculating a group of read thresholds to be applied during a reading operation of a set of flash memory cells that belong to a certain row of the multiple rows of the flash memory module based upon the compressed representation of reference read thresholds; and reading the set of flash memory cells by applying the group of reference read thresholds to provide read results.

According to an embodiment of the invention there may be provided a flash memory controller that is coupled to flash memory cells of a flash memory module, the flash memory may include a read threshold processing circuit that may be arranged to generate or receive read threshold information indicative of multiple read thresholds values that were applied when reading multiple flash memory cells that belong to multiple rows of a flash memory module; and generate a compressed representation of reference read thresholds to be applied during future read operations of the flash memory cells in response to the read threshold information.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 8-9 illustrate a method according to an embodiment of the invention.

Figure 1:
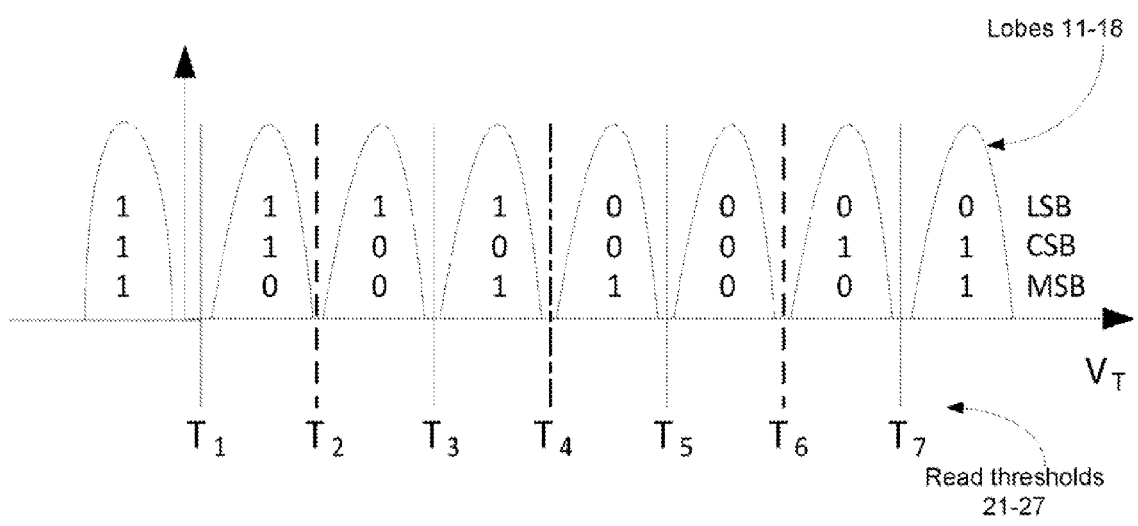
FIG. 1 illustrates a prior art threshold voltage distribution.
Figure 2:
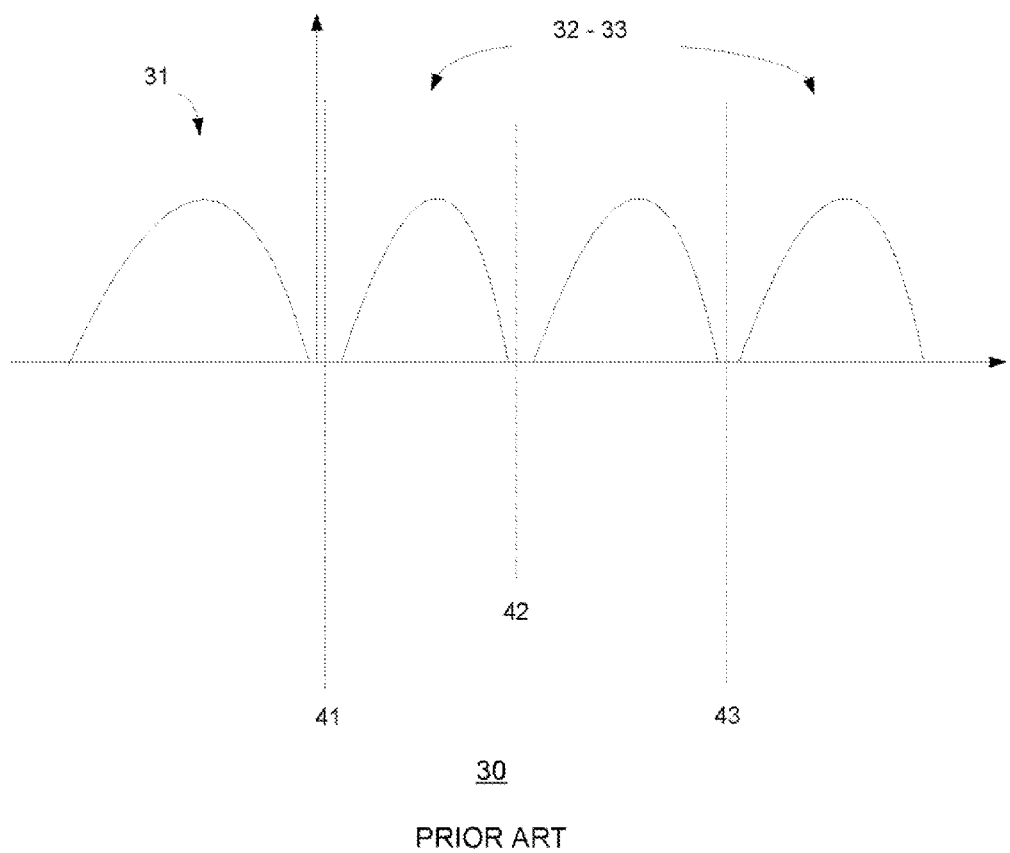
FIG. 2 illustrates a prior art threshold voltage distribution.
Figure 3:
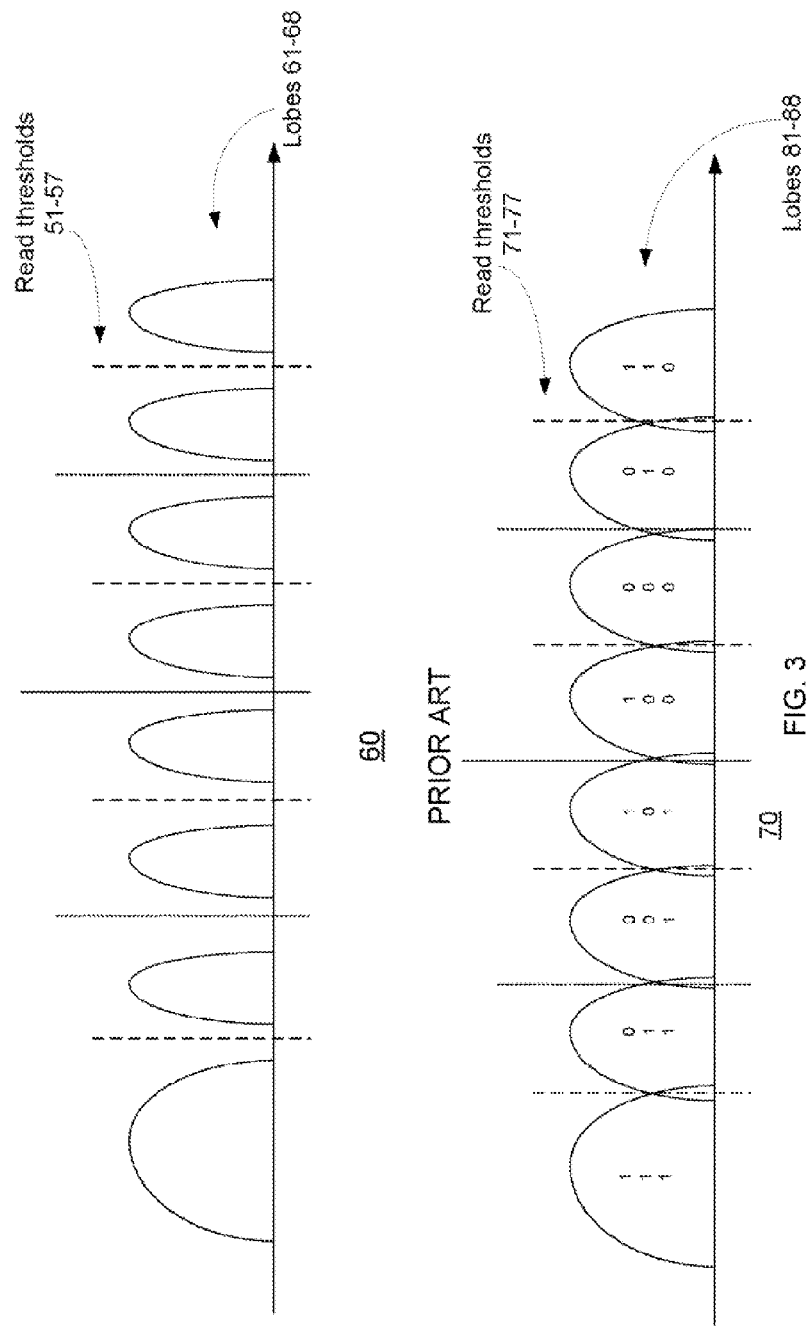
FIG. 3 illustrates a prior art threshold voltage distribution.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The following presents a method for generating and storing information indicative of the state of a flash memory module, such as but not limited to a NAND flash memory module. The following description will refer to the state of an erase block although it is applicable to the entire flash memory module, to a portion of the flash memory module and the like. A flash memory module may include one or more flash memory dice.

The terms erase block and block are used interchangeably in this specification.

A state of an erase block can be represented by several parameters, especially one or more parameters that indicate the optimal positioning of the read threshold.

It is noted that the following methods, devices and non-transitory computer readable media are not limited to a certain threshold voltage distribution.

Therefore, in the following, we describe a method for significantly reducing this storage requirement of state information.

It is noted that a flash memory module include multiple rows. It is assumed that the same read thresholds can be used to read flash memory cells that belong to the same row.

In the following description the reference to rows and the reference to read thresholds associated with the rows is used in an interchangeable manner. For example, a correlation between rows may mean a correlation between read thresholds associated with these rows.

According to an embodiment of the invention a system 100 is provided and may include a memory controller 110 and a flash memory module 180. The flash memory module 180 may be read, programmed or erased by the memory controller 110.

The memory controller 110 may include a read circuit 140, a programming circuit 150, a read threshold processing circuit 120 and an interface 130.

Figure 4:
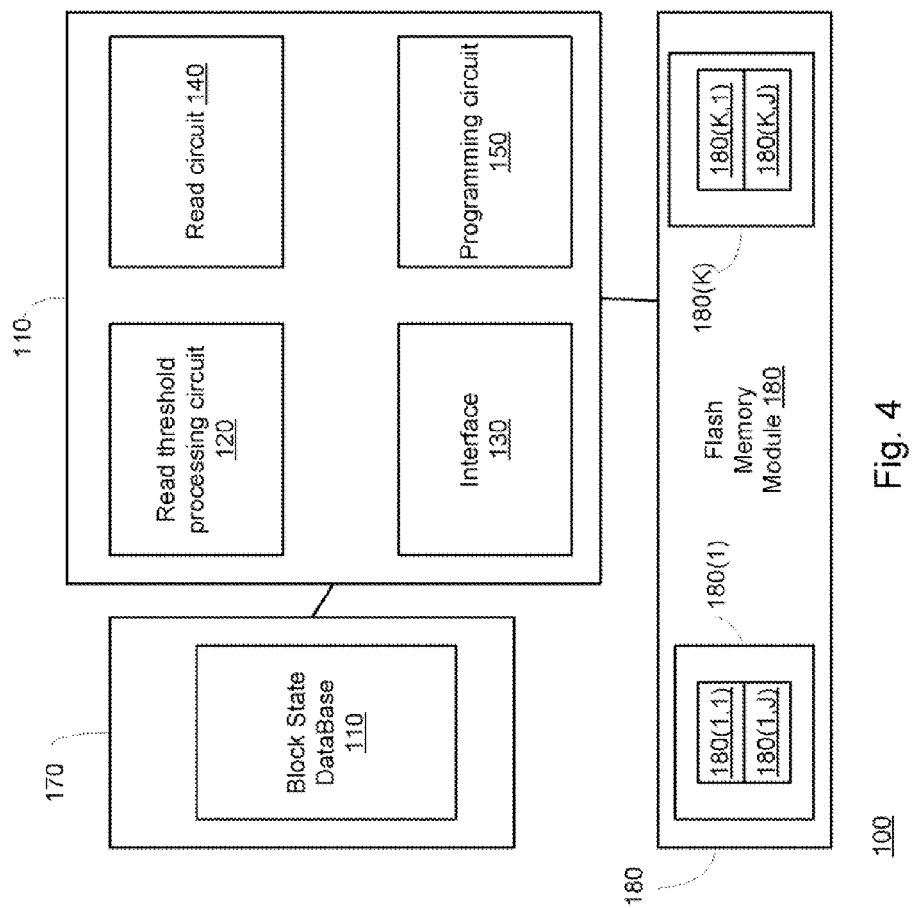
FIG. 4 illustrates a portion of a system according to an embodiment of the invention.

FIG. 4 also illustrates a block state database 190 that may be stored in the memory controller 110 or may be stored in a non-volatile memory module 170—as illustrated in FIG. 4.

The read circuit 140 may be arranged to read the flash memory module 180. The flash memory module 180 includes K erase blocks 180(1)-180(K), each erase block includes J rows, such as such as 180(1,1)-180(1,J) for erase block 180(1), and such as rows 180(K,1)-180(K,J) of erase block 180(K). It is noted that different erase blocks may share rows or may include different rows.

The programming circuit 150 may write to the flash memory module 180 and may perform erase operations.

The interface 130 facilitates access to the block state database 190.

The read threshold processing circuit 120 can determine read thresholds, can generate reference read thresholds, can generate a compressed representation of the reference read thresholds, can update one or more reference read thresholds, can reconstruct read thresholds based upon the compressed representation of reference read thresholds and the like.

During the update operation the read threshold processing circuit 120 may generate, replace or update reference read thresholds for all or part of the read thresholds in one or more rows in a block.

During a fetch operation one or more reference read thresholds are obtained from the block state database, and may be (a) used to read flash memory cells or (b) may be further processed to provide the read thresholds to be used when reading one or more rows.

The compression process may include at least one of the following:
  a. Row compaction: instead of holding the read thresholds for all the rows in a block, only reference read thresholds associated with a subset of the rows are stored. This can be done in various ways, as shown in the next sub section.
  b. Only a subset of possible values of reference read thresholds are stored. The possible range of values can be represented by a subset of values that may be calculated by quantization or other subset selection algorithms. The subset can be calculated while taking into account (for example—by minimizing) errors resulting from the selection of the subset.

Row Compaction

It has been found that the row compaction can utilize the similarity between the optimal (or sub-optimal) positioning of the read thresholds in one row to the near ones within a block. Statistical data of this correlation may be gathered (for example—it can be gathered offline) following experiments simulating different endurance and retention states of a representative set of flash memory modules. This read threshold statistics may then be used to construct estimators or predictors of a certain row read thresholds The correlators can be calculated in various manners, some are illustrated below.

Row Prediction Based on Row to Row Estimators

We start by choosing a reference row, which will be used to define the read thresholds for all rows in the block. We then construct two sets of estimators:

a. Reference to destination: A set of estimators used whenever we wish to read a page from the flash memory module. The read thresholds of the reference row of the required block are recovered from a block table database. Given this set, the read thresholds of the destination row are estimated and used for the page read command.

b. Destination to reference: From time to time we may wish to update the state of the block. This may be because we have learned better read threshold values. When we wish to update the state of the erase block and modify the reference read thresholds we require an update operation (as discussed above). During an update operation we obtain the read thresholds suggested for a destination row and modify accordingly the reference read thresholds stored for the reference row. These read reference thresholds may be a result of estimators based on the destination read thresholds.

Therefore, to use row prediction we would need to store in memory also the parameters used for the estimators of both sets where for each set we may have different parameters based on the destination row.

The estimators themselves may be Linear Minimum Mean Square estimators or Least Square Estimators for the set of all read thresholds in the reference or destination row to each of the read thresholds in the destination or reference row. Alternatively, the estimators may be based on a partial set of read thresholds in the reference or destination row.

We can also apply any other type of estimators, for example, non-linear functions of the reference or destination row read thresholds.

According to another embodiment of the invention read thresholds of the destination row are predicted directly from read thresholds of a last updated row. For the first read operation in a block, some default read thresholds may be used. The block state database may include an index of the last updated row in addition to its read thresholds.

To use row prediction in this case we would need to store in memory a set of estimators from any row, serving as the reference row, to any row, serving as the destination row.
Principal Component Analysis (PCA)

According to an embodiment of the invention compression may be obtained by using PCA. Using a statistical database (of optimal read threshold positions per row for several blocks and several flash memory dies under several endurance and retention conditions) we can construct a covariance matrix, $\lambda$, of the read thresholds per row as follows:

$$\lambda = E[(Th - E[Th])^T (Th - E[Th])]$$

Here Th is a row vector of read thresholds per NAND Flash blocks (e.g. a (7×# of rows per block) elements row vector for TLC device), E is equivalent to taking the average overall NAND Flash block read thresholds from the statistical read threshold database.

Thus, for each row vector the following calculation is calculated:

$$[(Th - E[Th])^T (Th - E[Th])]$$

The average of this calculation provides the covariance matrix $\lambda$.

Figure 5:
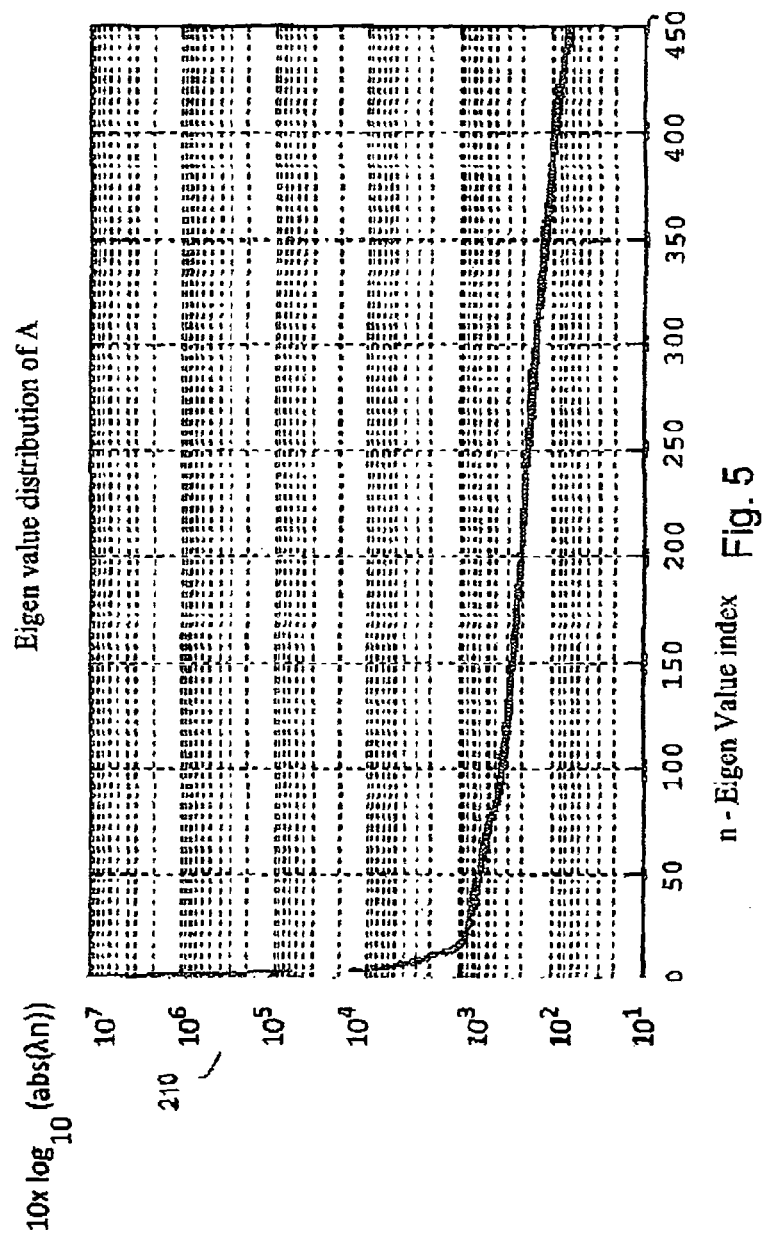
FIG. 5 illustrates singular vectors according to an embodiment of the invention.

We can then perform singular value decomposition (SVD) on $\lambda$ and sort the singular values according to their size. We then choose just a handful of singular vectors belonging to the largest singular values to reconstruct $\lambda$ and predict row read thresholds. An example for the distribution of the singular values of $\lambda$ is illustrated in curve 210 of FIG. 5.

For example, let $V_1, \ldots, V_t$ be the chosen singular vectors. Given the set of all read thresholds in the block, we can assign a multiplier to each of the singular vectors, by defining $\alpha_i = V_i^T \cdot (Th - E[Th])$ where $\cdot$ is the dot product between two vectors.

Thus, we can represent all the read thresholds for all blocks using the formula:

$$\vec{Th} = E[Th] + \sum_{i=1}^{t} \alpha_i V_i$$

The above defines the fetch read thresholds procedure from the block state database.

However, we should also consider the block state update operation. Usually, an update operation will occur after we learn the values of a small amount of the read thresholds in Th (e.g. part/all of the read thresholds of a single NAND Flash row).

Therefore, performing the calculation, $\alpha_i = V_i^T \cdot (Th - E[Th])$ may be replaced by building estimators of $\alpha_i$ based on all possible sub-groups of read thresholds of Th (e.g. the read thresholds of all flash memory module rows). More specifically we can represent the problem as follows:

$$Th = E[Th] + \overline{V}\overline{\alpha} + \overline{n}$$

Where $V = [V_1 \_ V_t]$ is a matrix containing all $V_i$, $\alpha = [\alpha_1 \ldots \alpha_t]^T$ a column vector containing all $\alpha_i$ and $\bar{n}$ is a noise vector with zero average.

In practice, when an update will occur it will be done based on a subset of read thresholds of Th. Therefore, we will use estimators of $\overline{\alpha}$ given a sub-group of Th read thresholds.

For brevity we divide Th into K equal-size non-overlapping sub-sections, which we denote by $Th_j$ (i.e. $Th = [Th_1^T Th_2^T \ldots Th_K^T]^T$). Similarly we divide the matrix $\overline{V}$ into corresponding sub matrices $\overline{V}^j$ and the noise vector to $\bar{n}_j$ such that $Th_j = E[Th_j] + \overline{V}^j \overline{\alpha} + \bar{n}_j$. We also use the following notation:

$$A = E[\overline{\alpha}\overline{\alpha}^T], N_j = E[\bar{n}_j \bar{n}_j^T]$$

Employing the linear model we arrive at $\bar{n}_j = Th_j - E[Th_j] - \overline{V}^j \overline{\alpha}$ Using the above notation we can write down LMMSE estimators of $\overline{\alpha}$ given $Th_j$, denoted by $\hat{\alpha}_j$, which are refined for every new subsection of read thresholds as follows:
$\hat{\alpha}_0 + 0$
$A_0 = A$ $$L_j = A_{j-1} \overline{V}^{jT} (\overline{V}^j A_{j-1} \overline{V}^{jT} + N_j)^{-1}$$

$$A_j = A_{j-1} - L_j \overline{V}^j A_{j-1}$$

$$\hat{\alpha}_j = \hat{\alpha}_{j-1} + L_j (Th_j - \overline{V}^j \hat{\alpha}_{j-1})$$

Dealing with estimators of $\overline{\alpha}$ given only part of the row read thresholds is handled through row swapping and different division of Th into non-overlapping sub-sections, not necessary of the same length. However, the same equations may be employed for the update of the state when this division is used as well.
Average Row Read Thresholds We can also define a block state based on the average row read thresholds taken over all block rows. Thus, we assign a state per each block (for TLC blocks, it will contain 7 numerals). Similar estimators as above can be applied to this state definition as well.

Row Reduction

Another method for reducing the amount of numerals used to represent all the block read thresholds is by using row reduction. In row reduction we simply represent the read thresholds of only some of the rows in the block. The idea is that many of the rows behave similarly and therefore, we can store the set of read thresholds only for a representative row.

Clustering methods may be used to define which rows are similar to which and limit the number of rows being considered to a small number.

This method can be also used together with any of the above methods to limit the constant parameter storage.

Read Threshold and State Quantization

For all row compaction methods, described above, storage of some row read thresholds is required per each block in the entire system. It is desired to reduce the amount of memory, required to store all these read thresholds, with negligible effect on reliability.

Vector Quantization Algorithms

A method, accomplishing this goal, is vector quantization of all row read thresholds, treating the n read thresholds as a point in an nD Euclidean space. Variable n refers to the number of thresholds per row. There is only one such vector of n thresholds per row at any moment.

In this method the entire nD space is split to M non-overlapping nD regions, covering the entire space.

$$R^n = \bigcup_{i=1}^{M} S_i; S_i \cap S_j = \phi \forall i \neq j$$

There are many ways to construct such regions, based on clustering of the nD points in the statistical database, described above.

Common method is the generalization of the 1D Max-Lloyd algorithm to n dimensions, known in the literature as the k—means algorithm, which yields a local minimum of the optimization problem. The algorithm involves setting M initial decision levels and iterating between defining the M decision regions $S_i$, i=1, 2, . . . , M from the M decision levels, and re-defining the M decision levels from these M decision regions, until some stopping criteria is met.

The online quantization for the k—means algorithm involves calculation of the Euclidean distance from the input nD point to the M centroids of the decision regions, with a complexity of O(M). It is desired that the online quantization process will be more efficient, and the presented approach requires only $\sim\log_2(M)$ operations.

Vector Quantization Using Modified Median Cut Algorithm

Figure 6:
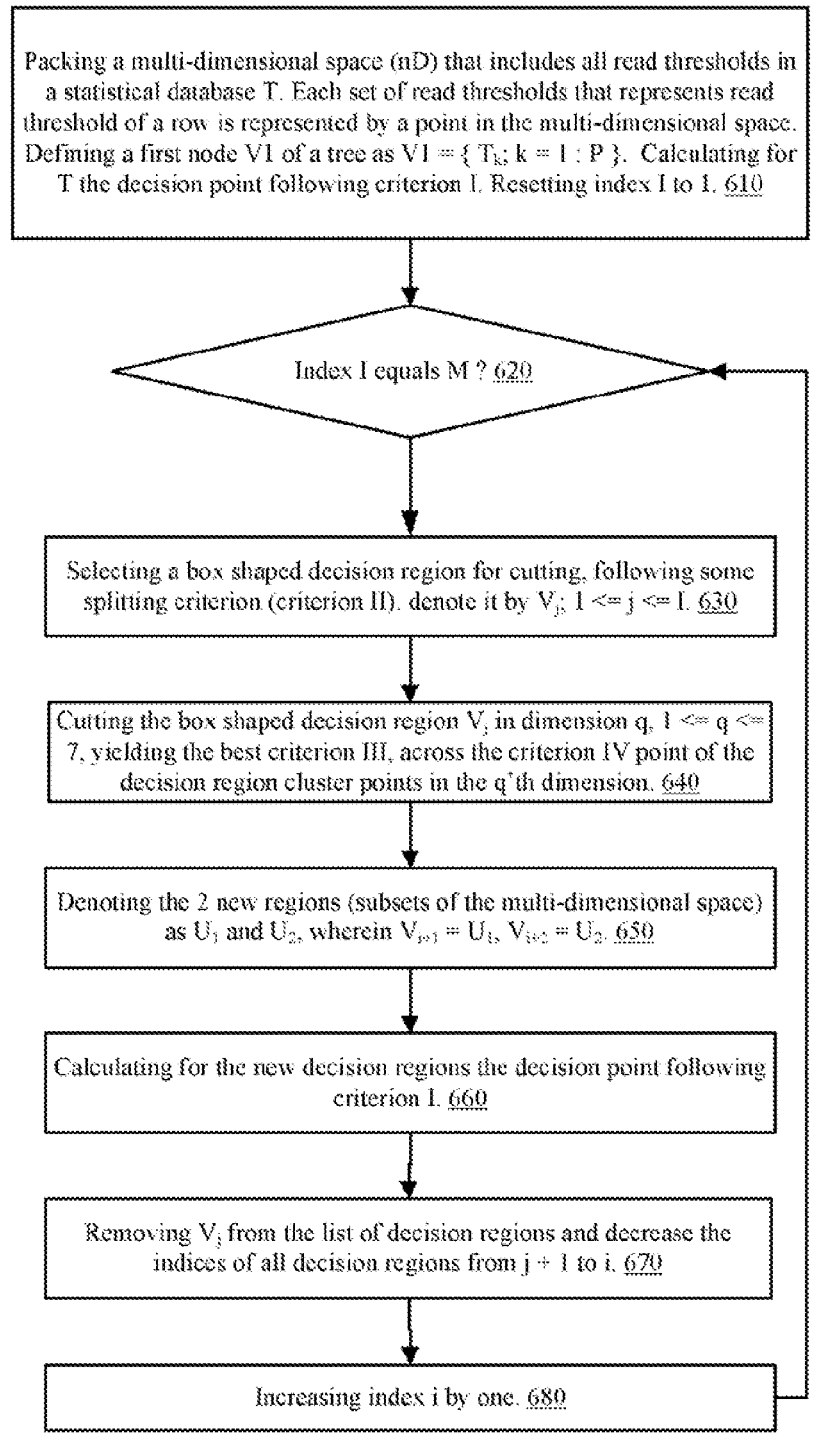
FIG. 6 illustrates a method according to an embodiment of the invention.

Following is a description of a Modified Median-Cut Vector Quantization (MMCVQ) algorithm, simultaneously yielding the box shaped quantization regions and a quantization tree, suitable for efficient implementation of the quantization process of FIG. 6.

Method 600 of FIG. 6 starts by stage 610 of performing a first partition of a multi-dimensional space (nD) that includes all read thresholds in the statistical database T. Each set of read thresholds that represents read threshold of a row is represented by a point in the multi-dimensional space. Stage 610 including defining a first node of a tree V1 as V1={$T_k$; k=1: P} and calculating for the T decision region the decision point following the decision-point criterion (criterion I). Stage 610 may also include resetting index I to 1.

Stage 610 is followed by performing multiple iterations for index i from 1 to M−1 (stages 630-670). The multiple repetitions are represented by stage 620 of asking if index i equals M and by stage 680 of increasing i by one.

Stage 630 includes selecting a box shaped decision region for cutting, following some decision region criterion (criterion II), denote it by $V_j$; 1<=j<=I.

Stage 640 includes cutting the box shaped decision region $V_j$ in dimension q, 1<=q<=7, yielding the best splitting dimension (criterion III), at the splitting point (criterion IV) of the decision region cluster points in the q'th dimension.

Stage 650 includes denoting the 2 new regions (subsets of the multi-dimensional space) as $U_1$ and $U_2$, wherein $V_{i+1}=U_1$, $V_{i+2}=U_2$.

Stage 660 includes calculating for the new decision regions the decision point following the decision-point criterion I.

Stage 670 may include removing $V_j$ from the list of decision regions and decrease the indices of all decision regions from j+1 to i.

According to an embodiment of the invention the employed splitting criteria are:

Criterion I can be at least one out of mean, median, some point between the mean/median and the end of the longer edge in the specific dimension, or any other definition.

Criterion II can be at least one out of number of points in the decision region, volume of the decision region, total/maximum/average number of errors for the points in the decision region, increase in total number of errors for the points in the decision region, increase in maximum number of errors per bit for the points in the decision region, or any combination of the above. The criterion may also vary with iteration index.

Criterion III can be at least one out of out of the options, defined for criterion II.

Criterion IV can be at least one out of the options, defined for criterion I.

The output of the algorithm is an array of M decision levels (medians of the clusters within the respective decision regions) and a tree structure of 2M−1 nodes. In the MMCVQ algorithm, in each stage a node $V_j$ is cut to two new nodes, $V_i$ and $V_{i+1}$. This description culminates in a full binary tree of 2M−1 nodes. Selecting M=$2^N$, the number of nodes in the tree is $2^{N+1}-1$.

The tree is not a complete (balanced) tree, so its depth is not bounded by N+1. However, a proper selection of the criterion of stage 610 may assure that the depth is not larger than 2×(N+1).

The tree may be further compacted to a full binary tree of $2^N-1$ nodes, instead of $2^{N+1}-1$.

Figure 7:
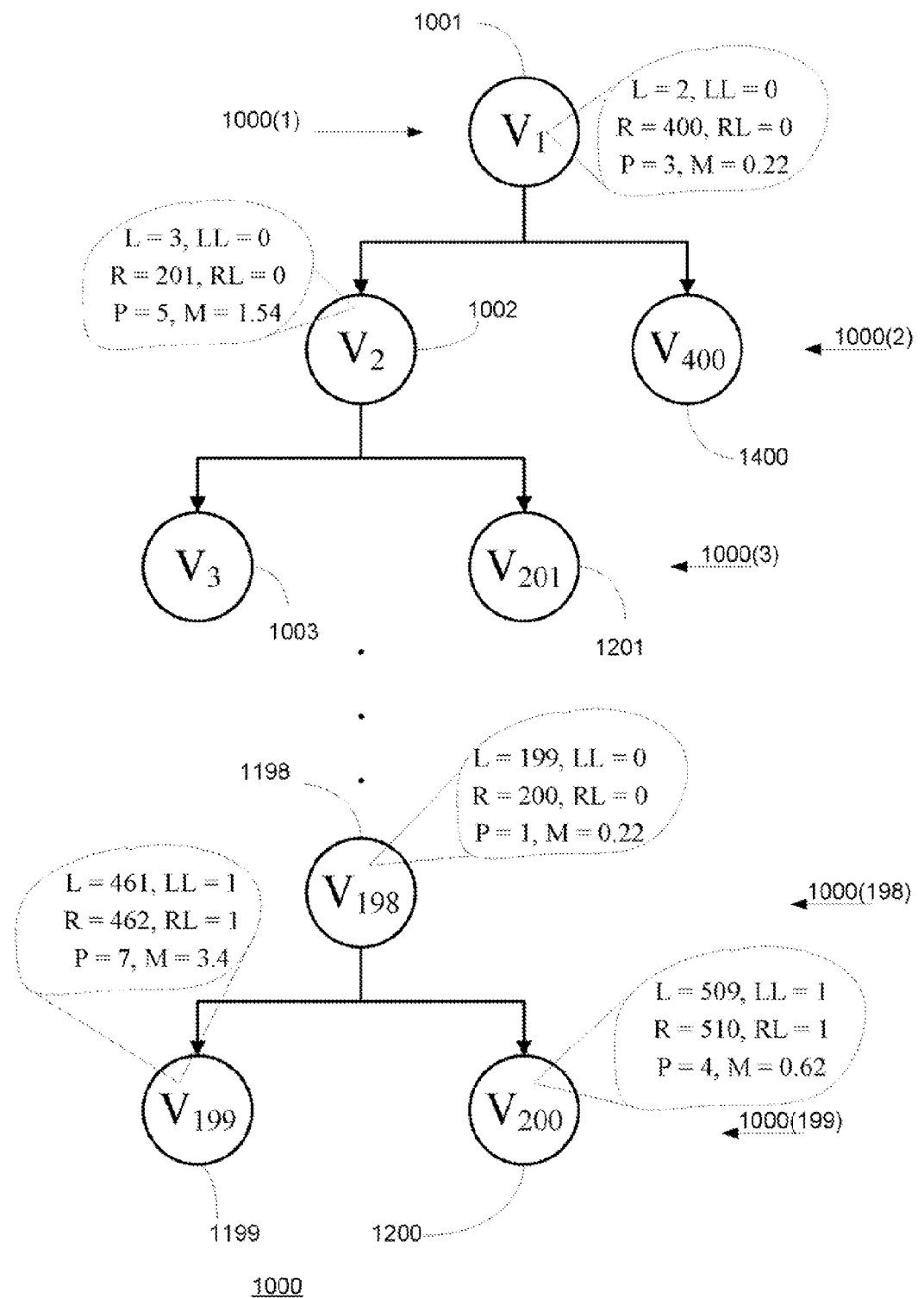
FIG. 7 illustrates a tree according to an embodiment of the invention.

In the compacted tree each node is of the following structure, as illustrated in FIG. 7 for a tree with 511 nodes:

L field—Left sub—tree node
R field—Right sub—tree node
LL field—Is the left sub—tree node a leaf node?
RL field—Is the left sub—tree node a leaf node?
P field—Median—cut plane
V field—Median—cut value When LL(RL) field is false, the L(R) field points to the left(right) sub—tree root. When LL(RL) field is true, the left(right) sub—tree is null, and the L(R) field points to the respective decision point read thresholds.

FIG. 7 illustrates a tree 1000 that has 199 levels 1000(1)-1000(199) that correspond to the 199 partition iterations that resulted in tree 1000. Thus M=199. The tree 1000 has multiple nodes, some of which (1001, 1002, 1003, 1199, 1400 and 1201) are shown.

Thus, the quantization operation itself is equivalent to a binary search over this tree, and off complexity of O(N).

With proper settings of the criteria mentioned above the quantization error decreases with N until reaching an asymptote. Very good performance was demonstrated with N=8. Thus, storage of the 7 row read thresholds in 7 Bytes is reduced to storage of the decision point pointer in 1-2 Bytes, for each block in the system. Additionally, the storage of the decision point table, of size $2^N \times 7$, is required. Thus, a significant saving in the space, required for the storage of the read thresholds, is achieved.

Figure 8:
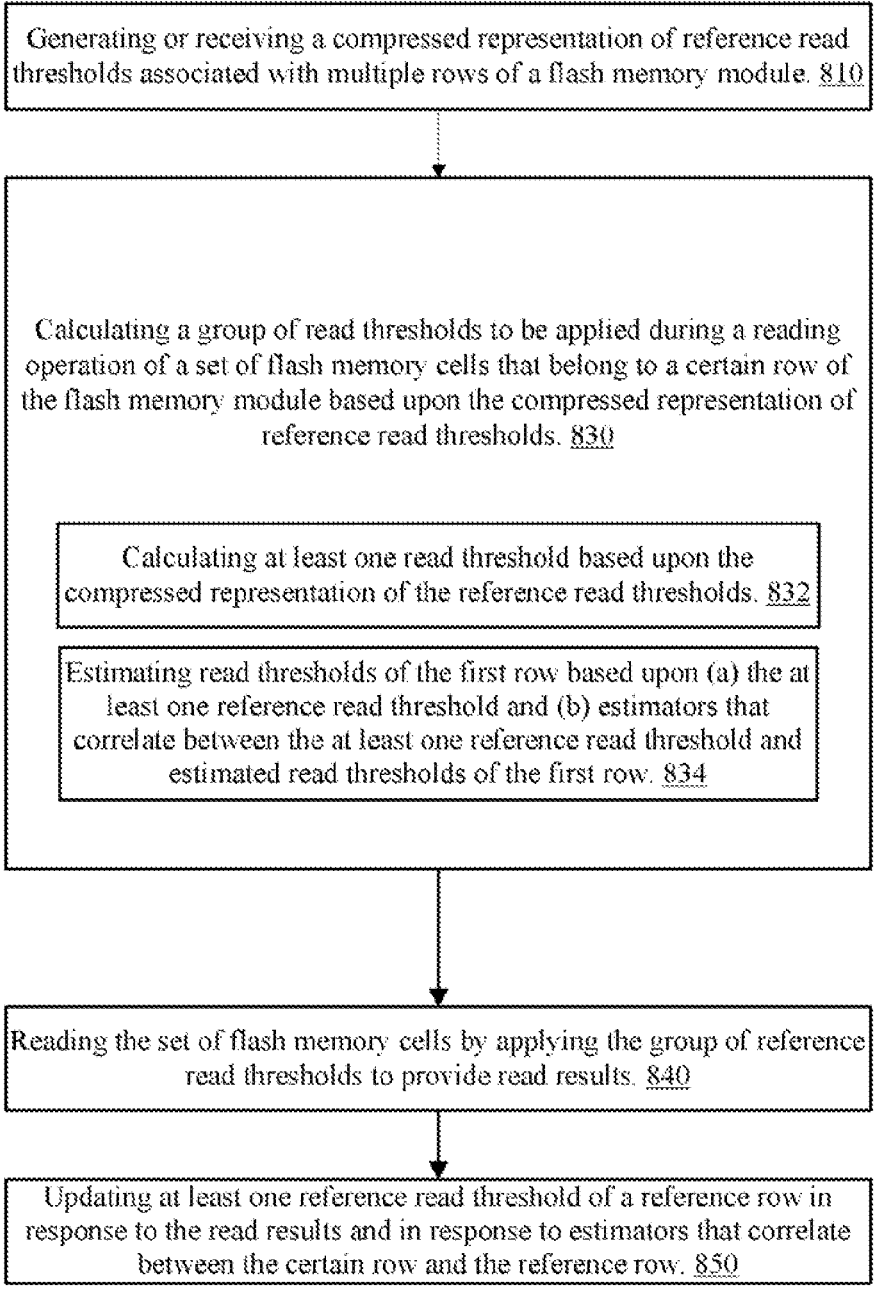

FIG. 8 illustrates method 800 according to an embodiment of the invention.

Method 800 may start by stage 810 of generating or receiving a compressed representation of reference read thresholds associated with multiple rows of a flash memory module.

The read thresholds are termed reference read thresholds as they may assist in calculating read thresholds (thereby may be used as references) that should be applied when reading flash memory cells.

The values of the reference read thresholds may form a subset of possible values of actual read thresholds to be applied when reading the flash memory module. Thus, stage 810 may include quantization of a possible range of values for read thresholds.

The multiple reference read thresholds may be associated with only some of the rows of the flash memory module—and the multiple rows (associated with the multiple reference read thresholds) may form a subset of rows of the flash memory module.

Figure 10:
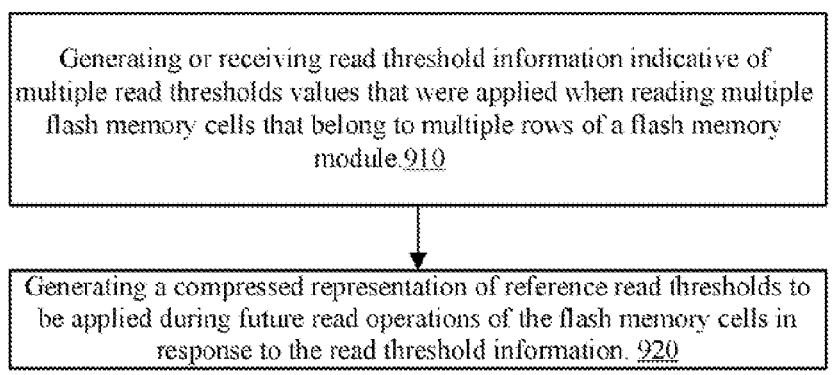
FIG. 10 illustrates a method according to an embodiment of the invention.

Stage 810 may include any one of stages 811-819 or a combination thereof. These stages (811-819) are illustrated in FIG. 10.

Stage 811 may include clustering rows of the flash memory modules to clusters in response to read threshold information associated with the rows, and selecting a subset of rows from each cluster to provide the multiple reference rows. This may have been referred to as clustering.

Stage 812 may include applying a principle component analysis (PCA) on read thresholds statistics to provide a group of singular vectors such as V1 . . . Vt mentioned above. These singular vectors can form the covariance matrix or be a part of the covariance matrix.

Stage 813 may include selecting the group of singular vectors out multiple singular vectors that are calculated during stage 812.

Stage 814 may include representing each group of read thresholds of a row of the flash memory module by a set of coefficients that map the group of read thresholds to the group of singular vectors. These coefficients may be a1 . . . at of vector a mentioned above.

Stage 815 may include applying a vector quantization algorithm on multiple vectors, each vector represents read thresholds associated with a row of the flesh memory module. Some methods for vector quantization were illustrated above—especially at the "threshold and state quantization" section.

Stage 816 may include partitioning a multi-dimension space to multiple subsets of the multi-dimensional space; and representing each of the subsets of the multi-dimensional space by a subset representative. Wherein the multi-dimensional space represents read threshold statistics of a plurality of rows of the flash memory module; and wherein a memory space required for storing all the subset representatives is smaller than a memory space required for storing the read threshold statistics. An example is provided in the section titled "vector quantization using modified media cut algorithm".

Stage 817 may include calculating a subset representative that represents a median value of values included in a subset of the multi-dimensional space that is represented by the subset representative.

Stage 818 may include representing the subsets (of stage 818) of the multi-dimensional space by a tree such as tree 1000 of FIG. 6.

Stage 818 may include applying multiple partitioning iterations. During each partition iteration (except the first partition iteration) a subset of the multi-dimensional space is partitioned.

Stage 819 may include representing the subsets of the multi-dimensional space by a tree that includes multiple levels, each level comprises a plurality of nodes, wherein each partition iteration is represented by a single level out of the multiple levels.

Stage 819 may include generating the node of the tree so that each node of the tree may include location information (such as L, R, LL, RR and P fields of FIG. 6) indicative of a location of the node in the tree, and partition information (such as M field of FIG. 6) indicative of a partition value of a partition iteration that corresponds to the level of the node.

Stage 810 may be followed by stage 830 of calculating a group of read thresholds to be applied during a reading operation of a set of flash memory cells that belong to a certain row of the flash memory module based upon the compressed representation of reference read thresholds.

Stage 830 may include stage 832 of calculating at least one read threshold based upon the compressed representation of the reference read thresholds. Stage 830 may include stage 834 of estimating read thresholds of the certain row based upon (a) the at least one reference read threshold and (b) estimators that correlate between the at least one reference read threshold and estimated read thresholds of the certain row.

The estimators of stage 834 may be calculated by linear minimum square algorithm or by least square estimators.

Stage 830 may be followed by stage 840 of reading the set of flash memory cells by applying the group of reference read thresholds to provide read results.

Stage 840 may be followed by stage 850 of updating at least one reference read threshold of a reference row in response to the read results and in response to estimators that correlate between the certain row and the reference row.

Method 800 or any of the stages illustrated in this application can be executed by a system that includes a memory controller and a flash memory module.

FIG. 9 illustrates method 900 according to an embodiment of the invention.

Method 900 for processing read threshold information may include stage 910 of generating or receiving read threshold information indicative of multiple read thresholds values that were applied when reading multiple flash memory cells that belong to multiple rows of a flash memory module.

Stage 910 may be followed by stage 920 of generating a compressed representation of reference read thresholds to be applied during future read operations of the flash memory cells in response to the read threshold information.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. In addition, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. Moreover, if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method comprising:
   generating or receiving read threshold information indicative of multiple read thresholds values that were applied when reading multiple flash memory cells that belong to multiple rows of a flash memory module;
   generating a compressed representation of reference read thresholds to be applied during future read operations of the flash memory cells in response to the read threshold information;
   calculating a group of read thresholds to be applied during a reading operation of a set of flash memory cells that belong to a certain row of the multiple rows of the flash memory module, the calculating is based upon the compressed representation of reference read thresholds; and
   reading the set of flash memory cells by applying the group of reference read thresholds to provide read results.

2. The method according to claim 1, wherein values of the reference read thresholds form a subset of possible values of actual read thresholds to be applied when reading the flash memory module.

3. The method according to claim 1, wherein the multiple reference rows form a subset of rows of the flash memory module.

4. The method according to claim 3, wherein values of the reference read thresholds form a subset of possible values of actual read thresholds to be applied when reading the flash memory module.

5. The method according to claim 1, wherein the calculating comprises: calculating at least one reference read threshold based upon the compressed representation of the reference read thresholds; estimating read thresholds of the certain row based upon (a) the at least one reference read threshold and (b) estimators that correlate between the at least one reference read threshold and estimated read thresholds of the certain row.

6. The method according to claim 5, comprising calculating the estimators by linear minimum square algorithm or by least squares estimators.

7. The method according to claim 1, comprising updating at least one reference read threshold of a reference row in response to the read results and in response to estimators that correlate between the certain row and the reference row.

8. The method according to claim 1, wherein the generating of the compressed representation comprises clustering rows of the flash memory modules to clusters in response to read threshold information associated with the rows, and selecting a subset of rows from each cluster to provide the multiple reference rows.

9. The method according to claim 1, wherein the generating of the compressed representation comprises: applying a principle component analysis on read thresholds statistics to provide a group of singular vectors; and representing each group of read thresholds of a row of the flash memory module by a set of coefficients that map the group of read thresholds to the group of singular vectors.

10. The method according to claim 9, comprising selecting the group of singular vectors out multiple singular vectors that are calculated during the applying of the principle component analysis.

11. The method according to claim 1, wherein the generating of the compressed representation comprises applying a vector quantization algorithm on multiple vectors, each vector represents read thresholds associated with a row of the flesh memory module.

12. The method according to claim 1, wherein the generating of the compressed representation comprises: partitioning a multi-dimension space to multiple subsets of the multi-dimensional space; and representing each of the subsets of the multi-dimensional space by a subset representative; wherein the multi-dimensional space represents read threshold statistics of a plurality of rows of the flash memory module; and wherein a memory space required for storing all the subset representatives is smaller than a memory space required for storing the read threshold statistics.

13. The method according to claim 12, wherein a subset representative represents a median value of values included in a subset of the multi-dimensional space that is represented by the subset representative.

14. The method according to claim 12, comprising representing the subsets of the multi-dimensional space by a tree.

15. The method according to claim 12, wherein the partitioning comprises applying multiple partitioning iterations.

16. The method according to claim 15, comprising representing the subsets of the multi-dimensional space by a tree that comprises multiple levels, each level comprises a plurality of nodes, wherein each partition iteration is represented by a single level out of the multiple levels.

17. The method according to claim 16, wherein each node comprises location information indicative of a location of the node in the tree, and partition information indicative of a partition value of a partition iteration that corresponds to the level of the node.

18. A non-transitory computer readable medium that stores instructions for: generating or receiving read threshold information indicative of multiple read thresholds values that were applied when reading multiple flash memory cells that belong to multiple rows of a flash memory module; generating a compressed representation of reference read thresholds to be applied during future read operations of the flash memory cells in response to the read threshold information; calculating a group of read thresholds to be applied during a reading operation of a set of flash memory cells that belong to a certain row of the multiple rows of the flash memory module, the calculating is based upon the compressed representation of reference read thresholds; and reading the set of flash memory cells by applying the group of reference read thresholds to provide read results.

19. A flash memory controller that is coupled to flash memory cells of a flash memory module,
the flash memory comprises a read threshold processing circuit arranged to generate or receive read threshold information indicative of multiple read thresholds values that were applied when reading multiple flash memory cells that belong to multiple rows of a flash memory module; and generate a compressed representation of reference read thresholds to be applied during future read operations of the flash memory cells in response to the read threshold information;
wherein the read threshold processing circuit is further arranged to calculate a group of read thresholds to be applied during a reading operation of a set of flash memory cells that belong to a certain row of the multiple rows of the flash memory module based upon the compressed representation of reference read thresholds; and
wherein the flash memory controller further comprises a read circuit arranged to read the set of flash memory cells by applying the group of reference read thresholds to provide read results.

20. The flash memory controller according to claim 19, wherein values of the reference read thresholds form a subset of possible values of actual read thresholds to be applied when reading the flash memory module.

21. The flash memory controller according to claim 19, wherein the multiple reference rows form a subset of rows of the flash memory module.

22. The flash memory controller according to claim 21, wherein values of the reference read thresholds form a subset of possible values of actual read thresholds to be applied when reading the flash memory module.

23. The flash memory controller according to claim 19, wherein the flash memory controller is configured to calculate at least one reference read threshold based upon the compressed representation of the reference read thresholds; estimating read thresholds of the certain row based upon (a) at least one reference read threshold and (b) the estimators that correlate between the at least one reference read threshold and estimated read thresholds of the certain row.

24. The flash memory controller according to claim 23, wherein the flash memory controller is configured to calculate the estimators by linear minimum square algorithm or by least squares estimators.

25. The flash memory controller according to claim 19, wherein the flash memory controller is configured to update at least one reference read threshold of a reference row in response to the read results and in response to estimators that correlate between the certain row and the reference row.

26. The flash memory controller according to claim 19, wherein the flash memory controller is configured to cluster rows of the flash memory modules to clusters in response to read threshold information associated with the rows, and selecting a subset of rows from each cluster to provide the multiple reference rows.

27. The flash memory controller according to claim 19, wherein the flash memory controller is configured to apply a principle component analysis on the read thresholds statistics to provide group of singular vectors; and representing each group of read thresholds of a row of the flash memory module by a set of coefficients that map the group of read thresholds to the group of singular vectors.

28. The flash memory controller according to claim 27, wherein the flash memory controller is configured to select the group of singular vectors out multiple singular vectors that are calculated during the applying of the principle component analysis.

29. The flash memory controller according to claim 19, wherein the flash memory controller is configured to apply a vector quantization algorithm on multiple vectors, each vector represents read thresholds associated with a row of the flesh memory module.

30. The flash memory controller according to claim 19, wherein the flash memory controller is configured to partition a multi-dimension space to multiple subsets of the multi-dimensional space; and represent each of the subsets of the multi-dimensional space by a subset representative; wherein the multi-dimensional space represents read threshold statistics of a plurality of rows of the flash memory module; and wherein a memory space required for storing all the subset representatives is smaller than a memory space required for storing the read threshold statistics.

31. The flash memory controller according to claim 30, wherein a subset representative represents a median value of values included in a subset of the multi-dimensional space that is represented by the subset representative.

32. The flash memory controller according to claim 30, wherein the flash memory controller is configured to representing the subsets of the multi-dimensional space by a tree.

33. The flash memory controller according to claim 30, wherein the flash memory controller is configured to applying multiple partitioning iterations during the partitioning.

34. The flash memory controller according to claim 33, wherein the flash memory controller is configured to represent the subsets of the multi-dimensional space by a tree that comprises multiple levels, each level comprises a plurality of nodes, wherein each partition iteration is represented by a single level out of the multiple levels.

35. The flash memory controller according to claim 34, wherein each node comprises location information indicative of a location of the node in the tree, and partition information indicative of a partition value of a partition iteration that corresponds to the level of the node.

36. The non-transitory computer readable medium according to claim 18, wherein values of the reference read thresholds form a subset of possible values of actual read thresholds to be applied when reading the flash memory module.

37. The non-transitory computer readable medium according to claim 18, wherein the multiple reference rows form a subset of rows of the flash memory module.

38. The non-transitory computer readable medium according to claim 37, wherein values of the reference read thresholds form a subset of possible values of actual read thresholds to be applied when reading the flash memory module.

39. The non-transitory computer readable medium according to claim 18, wherein the calculating comprises: calculating the at least one reference read threshold based upon the compressed representation of the reference read thresholds; estimating read thresholds of the certain row based upon (a) the at least one reference read threshold and (b) the estimators that correlate between the at least one reference read threshold and estimated read thresholds of the certain row.

40. The non-transitory computer readable medium according to claim 39, that stores instructions for calculating the estimators by linear minimum square algorithm or by least squares estimators.

41. The non-transitory computer readable medium according to claim 18, that stores instructions for updating the at least one reference read threshold of the reference row in response to the read results and in response to the estimators that correlate between the certain row and the reference row.

42. The non-transitory computer readable medium according to claim 18, wherein the generating of the compressed representation comprises clustering rows of the flash memory modules to clusters in response to read threshold information associated with the rows, and selecting a subset of rows from each cluster to provide the multiple reference rows.

43. The non-transitory computer readable medium according to claim 18, that stores instructions for applying the principle component analysis on the read thresholds statistics to provide group of singular vectors; and representing each group of read thresholds of the row of the flash memory module by the set of coefficients that map the group of read thresholds to the group of singular vectors.

44. The non-transitory computer readable medium according to claim 43, that stores instructions for selecting the group of singular vectors out multiple singular vectors that are calculated during the applying of the principle component analysis.

45. The non-transitory computer readable medium according to claim 18, that stores instructions for applying a vector quantization algorithm on multiple vectors, each vector represents read thresholds associated with a row of the flesh memory module.

46. The non-transitory computer readable medium according to claim 18, that stores instructions for partitioning the multi-dimension space to multiple subsets of the multi-dimensional space; and representing each of the subsets of the multi-dimensional space by the subset representative; wherein the multi-dimensional space represents read threshold statistics of the plurality of rows of the flash memory module; and wherein the memory space required for storing all the subset representatives is smaller than the memory space required for storing the read threshold statistics.

47. The non-transitory computer readable medium according to claim 46, wherein a subset representative represents a median value of values included in a subset of the multi-dimensional space that is represented by the subset representative.

48. The non-transitory computer readable medium according to claim 46, that stores instructions for representing the subsets of the multi-dimensional space by a tree.

49. The non-transitory computer readable medium according to claim 46, wherein the partitioning comprises applying multiple partitioning iterations.

50. The non-transitory computer readable medium according to claim 49, that stores instructions for representing the subsets of the multi-dimensional space by a tree that comprises multiple levels, each level comprises a plurality of nodes, wherein each partition iteration is represented by a single level out of the multiple levels.

51. The non-transitory computer readable medium according to claim 50, wherein each node comprises location information indicative of a location of the node in the tree, and partition information indicative of a partition value of a partition iteration that corresponds to the level of the node.

* * * * *